United States Patent [19]

Chao et al.

[11] Patent Number: 4,678,941
[45] Date of Patent: Jul. 7, 1987

[54] BOOST WORD-LINE CLOCK AND DECODER-DRIVER CIRCUITS IN SEMICONDUCTOR MEMORIES

[75] Inventors: Hu H. Chao, Pleasantville West; Nicky Chau-Chun Lu, Yorktown Heights, both of N.Y.

[73] Assignee: International Business Machines Corporation, Armonk, N.Y.

[21] Appl. No.: 727,301

[22] Filed: Apr. 25, 1985

[51] Int. Cl.⁴ .......................................... H03K 19/096
[52] U.S. Cl. .................................... 307/449; 307/269; 307/481; 307/482; 307/463; 365/230
[58] Field of Search ............... 307/449, 463, 262, 269, 307/480–482, 578; 365/230

[56] References Cited

U.S. PATENT DOCUMENTS

| | | | |
|---|---|---|---|
| 3,778,784 | 12/1973 | Karp et al. | 307/482 X |
| 3,801,831 | 4/1974 | Dame | 307/251 |
| 3,852,625 | 12/1974 | Kubo | 307/304 |
| 3,943,377 | 3/1976 | Suzuki | 307/205 |
| 3,947,829 | 3/1976 | Suzuki | 340/173.5 |
| 3,982,138 | 9/1976 | Luisi et al. | 307/205 |
| 3,999,081 | 12/1976 | Nakajima | 307/205 |
| 4,000,412 | 12/1976 | Rosenthal et al. | 307/208 |
| 4,029,973 | 6/1977 | Kobayashi et al. | 307/264 |
| 4,045,691 | 8/1977 | Asano | 307/264 |
| 4,061,929 | 12/1977 | Asano | 307/246 |
| 4,145,622 | 3/1979 | Hofmann et al. | 307/449 |
| 4,156,938 | 5/1979 | Proebsting et al. | 365/63 |
| 4,194,130 | 3/1980 | Moench | 307/205 |
| 4,200,917 | 4/1980 | Moench | 365/208 |
| 4,216,390 | 8/1980 | Stewart | 307/264 |
| 4,259,731 | 3/1981 | Moench | 365/206 |
| 4,264,828 | 4/1981 | Perlegos et al. | 307/463 |
| 4,309,629 | 1/1982 | Kamuro | 307/449 |
| 4,330,719 | 5/1982 | Nagami | 307/578 X |
| 4,344,005 | 8/1982 | Stewart | 307/463 |
| 4,429,374 | 1/1984 | Tanimura | 365/230 |
| 4,433,257 | 2/1984 | Kinoshita | 307/443 |
| 4,496,850 | 1/1985 | Takemae et al. | 307/269 |
| 4,514,829 | 4/1985 | Chao | 307/449 X |
| 4,571,503 | 2/1986 | Tobita | 307/449 X |

OTHER PUBLICATIONS

Aipperspach et al., "Bootstrap Voltage Generator for Dynamic RAM Array", *IBM TDB* vol. 25, No. 7A, pp. 3234–3235; 12/1982.

Tien, "Bit Line Selection Circuit for Programming Level Voltages in an Electrically Alterable Read–Only Storage", *IBM TDB;* vol. 23, No. 10, pp. 4574–4576; 3/1981.

IBM Technical Disclosure Bulletin, vol. 25, No. 4, Sep. 1982, pp. 2135–2136, L. M. Terman, "CMOS Decoder Circuit".

IBM Technical Disclosure Bulletin, vol. 18, No. 12, May 1976, pp. 3955–3956, G. H. Parikh, "High-Speed FET Decoder."

*Primary Examiner*—Stanley D. Miller
*Assistant Examiner*—D. R. Hudspeth
*Attorney, Agent, or Firm*—John J. Goodwin

[57] ABSTRACT

A CMOS boost word-line clock and decoder-driver circuit which can be used for CMOS DRAM's with substrate bias in addition to VDD supply. A boost word-line clock circuit including simple CMOS inverters is used for the word-line boost and the possible voltage overshoot, which usually occurs because of capacitor two-way boost, can be completely eliminated. Also, the circuit can be triggered by a single clock. A high performance decoder circuit is provided in combination with the aforesaid CMOS boost word-line clock circuit, such decoder using NMOS pass-gate in the decoder driver and providing fast word-line boosting. The timing between the decoder and the word-line clock activation is not crucial.

6 Claims, 6 Drawing Figures

BOOST WORD-LINE CLOCK AND DECODER-DRIVER CIRCUITS IN SEMICONDUCTOR MEMORIES

BACKGROUND OF THE INVENTION

1. Field of the Invention

The present invention relates to voltage boosting and decoder circuits, and more particularly to semiconductor clock and decoder-driver circuits for boosting word-line voltage in a random access memory.

2. Description of Prior Art

The present invention relates to a voltage boosting word-line clock circuit including a fast decoder.

Voltage boosting circuits are described in the prior art in various configurations for a variety of purposes.

U.S. Pat. No. 4,061,929 issued Dec. 6, 1977 to Asano entitled CIRCUIT FOR OBTAINING DC VOLTAGE HIGHER THAN POWER SOURCE VOLTAGE describes a voltage boosting circuit which comprises a plurality of units connected in sequence and each composed of a condenser and a plurality of MOS-FETs without any transformer or diode.

U.S. Pat. No. 4,029,973 issued June 14, 1977 to Kobayashi et al entitled VOLTAGE BOOSTER CIRCUIT USING LEVEL SHIFTER COMPOSED OF TWO COMPLEMENTARY MIS CIRCUITS discloses an improvement for a voltage booster circuit. The improvement lies in the use of MISFETs as switching means in a level converting circuit constructed in a complementary MIS semiconductor integrated circuit and therefore the voltage loss due to the conventional switching means can be prevented.

In U.S. Pat. No. 4,216,390 issued Aug. 5, 1980 to Stewart entitled LEVEL SHIFT CIRCUIT a gating means, biased to pass current only during signal transitions, transfers binary signals from an input signal source to a latch circuit when the signal source and the latch are operated at similar voltages. Following data transfer, the operating voltage across the latch is increased. The voltage levels of the latch output signals are correspondingly increased but the state to which the latch was set is maintained and there is no steady state current conduction through the gating means.

In U.S. Pat. No. 4,045,691 issued Aug. 30, 1977 to Asano, also entitled LEVEL SHIFT CIRCUIT, a level shift circuit is disclosed including an inverter connected to a first voltage supply source and supplied with an input pulse. A condenser and a directional switching element are connected in series between the output point of the inverter and one potential point of the first voltage supply source. The input of a first MOS-FET is connected to the output of the inverter while the input of a second MOS-FET is connected to a connection point between the condenser and the directional switching element. The source of the first MOS-FET is connected to a common terminal of first and second voltage supply sources while the source of the second MOS-FET is connected to the other terminal of the second voltage supply source. An output voltage is generated between a common connecting point of the the drains of the first and second MOS-FETs and one potential point of the second voltage supply source.

Circuits for generating pulsating potentials and voltage levels outside the range of, and/or of greater magnitude than, the operating potential applied to the circuits are described in U.S. Pat. No. 4,000,412 issued Dec. 28, 1976 to Rosenthal et al entitled VOLTAGE AMPLITUDE MULTIPLYING CIRCUITS. Each circuit includes first and second transistors for applying a first voltage to one plate of a capacitor and a second voltage to the other plate of the capacitor, during one time interval. During a subsequent time interval, the first and second transistors are turned off and a third transistor applies the second potential to the one plate of the capacitor. The change in the potential at the one plate of the capacitor is coupled to the other plate of the capacitor at which is produced an output potential outside the range of the first and second voltages. The potential difference between the first voltage and the output potential difference is greater in amplitude than the potential difference between the first and second voltages. The circuit may also include means alternately applying the first voltage and then the output potential to an output point for generating pulsating signals of greater amplitude than the magnitude of the applied potential. The outputs of two or more circuits may be combined to produce direct current (d.c.) levels. Also included are circuits which operate from a pulsating source of operating potential.

Other references in the general field of voltage or level boosting include the following U.S. Patents:

U.S. Pat. No. 3,999,081 by T. Nakajima entitled CLOCK-CONTROLLED GATE CIRCUIT issued Dec. 21, 1976;

U.S. Pat. No. 3,982,138 by Luisi et al entitled HIGH SPEED-LOW COST, CLOCK CONTROLLED CMOS LOGIC IMPLEMENTATION issued Sept. 21, 1976;

U.S. Pat. No. 3,947,829 by Y. Suzuki entitled LOGICAL CIRCUIT APPARATUS issued Mar. 30, 1976;

U.S. Pat. No. 3,943,377 by Y. Suzuki entitled LOGIC CIRCUIT ARRANGEMENT EMPLOYING INSULATED GATE FIELD EFFECT TRANSISTORS issued Mar. 9, 1976;

U.S. Pat. No. 3,852,625 by M. Kubo entitled SEMICONDUCTOR CIRCUIT issued Dec. 3, 1974;

U.S. Pat. No. 3,801,831 by J. S. Dame entitled VOLTAGE LEVEL SHIFTING CIRCUIT issued Apr. 2, 1974.

A variety of decoder circuits for semiconductor memories are described in the prior art.

In U.S. Pat. No. 4,309,629 issued Jan. 5, 1982 to Kamuro, entitled MOS TRANSISTOR DECODER CIRCUIT, an MOS transistor decoder circuit is disclosed including a plurality of MOS transistors, a load element, and at least one additional MOS transistor connected to the plurality of MOS transistors and the load element for selecting either of two output terminals for the plurality of MOS transistors, through which decoded output signals are developed. The two additional MOS transistors connected to the two output terminals have normal and complement bit signals, respectively.

In U.S. Pat. No. 4,264,828 issued Apr. 28, 1981 to Perlegos et al, entitled MOS STATIC DECODING CIRCUIT, a metal-oxide-semiconductor static decoding circuit for selecting an addressed line in a high density memory array, or the like, is disclosed. The circuit is laid-out along array lines where the lines have a given pitch. Three levels of decoding are employed. The highest level permits the pulling-up of a common node in the second level decoder. The third level of decoding selects one of a plurality of array lines coupled to this node. Zero threshold voltage MOS devices are employed for coupling the first and third decoders to the second decoder.

In U.S. Pat. No. 4,259,731 issued Mar. 31, 1981 to Moench, entitled QUIET ROW SELECTION CIRCUITRY, there is provided a quiet row select circuit for holding unselected word-lines or row select lines in a memory array at a predetermined voltage potential.

Transistors are used to couple each row select line to the predetermined voltage potential. The adjacent row select lines of at least one of the adjacent select lines is always coupled to the predetermined voltage when in an unselected state. A transistor is also used to couple each of the adjacent row select lines together and this transistor is enabled whenever the adjacent row select lines are nonselected so that both row select lines are coupled together to the predetermined voltage level.

In another reference of Moench, U.S. Pat. No. 4,200,917 issued Apr. 29, 1980, entitled QUIET COLUMN DECODER, a decoder is provided for semiconductor memory systems which prevents glitches from being coupled into the silicon substrate during the period of time that the sense amplifiers are sensing data on the bit sense lines. The quiet column decoder has double clock NOR gates which allows the address lines to be continuous non-multiplexed lines. The double clocked NOR gate has two transistors for precharging a first and a second node within the NOR gate. Another transistor is coupled between the second node and a voltage reference terminal to serve as an enabling device for the NOR gate. The first node of the NOR gate serves as an output for the column decoder.

In U.S. Pat. No. 4,429,374 issued Jan. 31, 1984 to Tanimura, entitled MEMORY ARRAY ADDRESSING, an address decoder for one memory axis is disclosed which comprises NAND circuits while the address decoder for the other axis comprises NOR circuits.

A semiconductor memory circuit device comprises at least first and second decoder circuits. The first decoder circuit is so constructed as to receive at least partial address signals among address signals of a plurality of bits and to provide decoded signals of the partial address signals as intermediate signals. The second decoder circuit is so constructed as to receive the intermediate signals, to thereby provide signals for selecting from among a plurality of memory circuits a memory circuit determined by the address signals of the plurality of bits.

A publication entitled "CMOS Decoder Circuit" by L. M. Terman, at page 2135 of Vol. 25, No. 4 September 1982 of the IBM Technical Disclosure Bulletin relates to improvements in CMOS decoder circuits, and particularly to a decoder circuit which does not dissipate DC power. The decoder is followed with two branches with CMOS drivers for word-lines.

In Vol. 18, No. 12, May 1976 of the IBM Technical Disclosure Bulletin, G. H. Parikh in a publication entitled "High Speed FET Decoder" at page 3955 describes a field-effect transistor decoder circuit which allows improved speed of decoding FET random-access memories, by reducing the capacitance required to be discharged in an unselected decoder. The speed is further increased by reducing the capacitance of the nodes to be discharged wherein isolation transistor devices are provided to isolate the capacitance on word-line voltage nodes to allow bootstrapping to occur if a node has not been discharged.

Other related prior art includes the following references:

U.S. Pat. No. 4,194,130 to Moench issued Mar. 18, 1980, entitled DIGITAL PREDECODING SYSTEM;

U.S. Pat. No. 4,433,257 to Kinoshita issued Feb. 21, 1984, entitled VOLTAGE SUPPLY FOR OPERATING A PLURALITY OF CHANGING TRANSISTORS IN A MANNER WHICH REDUCES MINORITY CARRIER DISRUPTION OF ADJACENT MEMORY CELLS;

U.S. Pat. No. 4,156,938 to Proebsting et al issued May 29, 1979, entitled MOSFET MEMORY CHIP WITH SINGLE DECODER AND BI-LEVEL INTERCONNECT LINES;

U.S. Pat. No. 4,344,005 to Stewart issued Aug. 10, 1982, entitled POWER GATED DECODING.

The prior art listed above is representative of the state of the art prior to the present invention, and does not anticipate or make obvious the inventive features described herein.

SUMMARY OF THE INVENTION

An object of the present invention is to provide an improved clock circuit for boosting word-line voltage in a random access memory.

Another object of the present invention is to provide an improved clock circuit for boosting word-line voltage using substrate bias in addition to the supply voltage.

A further object of the present invention is to provide an improved CMOS clock circuit for boosting word-line voltage in a DRAM.

Still another object of the present invention is to provide a boosting word-line clock in CMOS DRAM including a fast decoder circuit using a NMOS device pass-gate device as decoder driver.

A further object of the present invention is to provide improved decoders for a boosting word-line clock using PMOS transistors to isolate a NMOS pass-gate device node from a decoder node.

The foregoing and other objects, features and advantages of the invention will be apparent from the following more particular description of the invention as illustrated in the accompanying drawings.

DESCRIPTION OF THE INVENTION

In many NMOS semiconductor memories such as dynamic random access memories (DRAM's) the word-line voltage is boosted above the supply voltage VDD so that full signal can be stored in or read from the storage cell without threshold voltage loss. In available CMOS semiconductor memories (DRAM's) N-well technology is used and a PMOS transistor is chosen as an access transistor of the memory cell to reduce soft error rates due to radiation and minority carrier injection from peripheral circuits. Therefore, the selected word-line level changes, for example, from a nominal 5 to 0 V and if the word-line signal is not boosted, the charge storage suffers a PMOS threshold voltage loss. For example, if VDD=4.5 V, threshold voltage VT of PMOS=1.6 V, the actual stored voltage is only 2.9 V. By including the leakage effect, the signal can be reduced to less than 2.5 V. Although such small signal can still be tolerated for 64 K DRAM using very large storage capacitor, it becomes very undesirable for higher density chip. Also, when the chip density increases up to 1 megabits and/or the supply voltage scales down below the standard 5 V, because the storage capacitor area has to be limited below a certain value to maintain reasonable chip size, the threshold voltage loss during the signal restoring is hardly tolerated. Therefore, the boost word-line circuit is an important element of the system.

The present invention provides a CMOS boost word-line clock circuit which can be used for CMOS DRAM's with substrate bias in addition to VDD supply. Simple CMOS inverters are used for the word-line boost and the possible voltage overshoot, which usually occurs because of capacitor two-way boost, can be completely eliminated. Also, the circuit can be triggered by a single clock.

The present invention also provides a high performance decoder circuit in combination with the aforesaid CMOS boost word-line clock circuit, such decoder using NMOS pass-gate in the decoder driver and providing fast word-line boosting. The timing between the decoder and the word-line clock activation is not crucial.

In order to boost the word-line below 0 V, a negative substrate bias is preferred. It avoids the junction forward-biasing due to voltage undershoot below 0 V at NMOS source or drain, thus simplifying the design and speeding up the word-line clock pull-down when compared to the word-line boost clock circuit without using the substrate bias. Also, by using the negative substrate bias, a fast decoder can be used to pass the boost word-line clock onto the word-line. In addition, the substrate bias gives less substrate sensitivity of NMOS transistors and smaller junction capacitances, both of which speed up the circuit performance. Also, one problem on designing CMOS boost circuits is that the PMOS source or drain cannot tolerate voltage overshoots above VDD+0.6 V. A voltage overshoot will forward-bias the $P^{30}$ N junctions to cause carrier injection, thus inducing either malfunction of the dynamic circuits and storage charge or latch-up. However, since a boost capacitor is used between the output of the word-line clock circuit and the output of an inverter used to boost the word-line clock, the unavoidable two-way boost occurring between these two outputs can easily cause overshoot. The circuit of the present invention eliminates such an overshoot under two-way boost.

Figure 1:
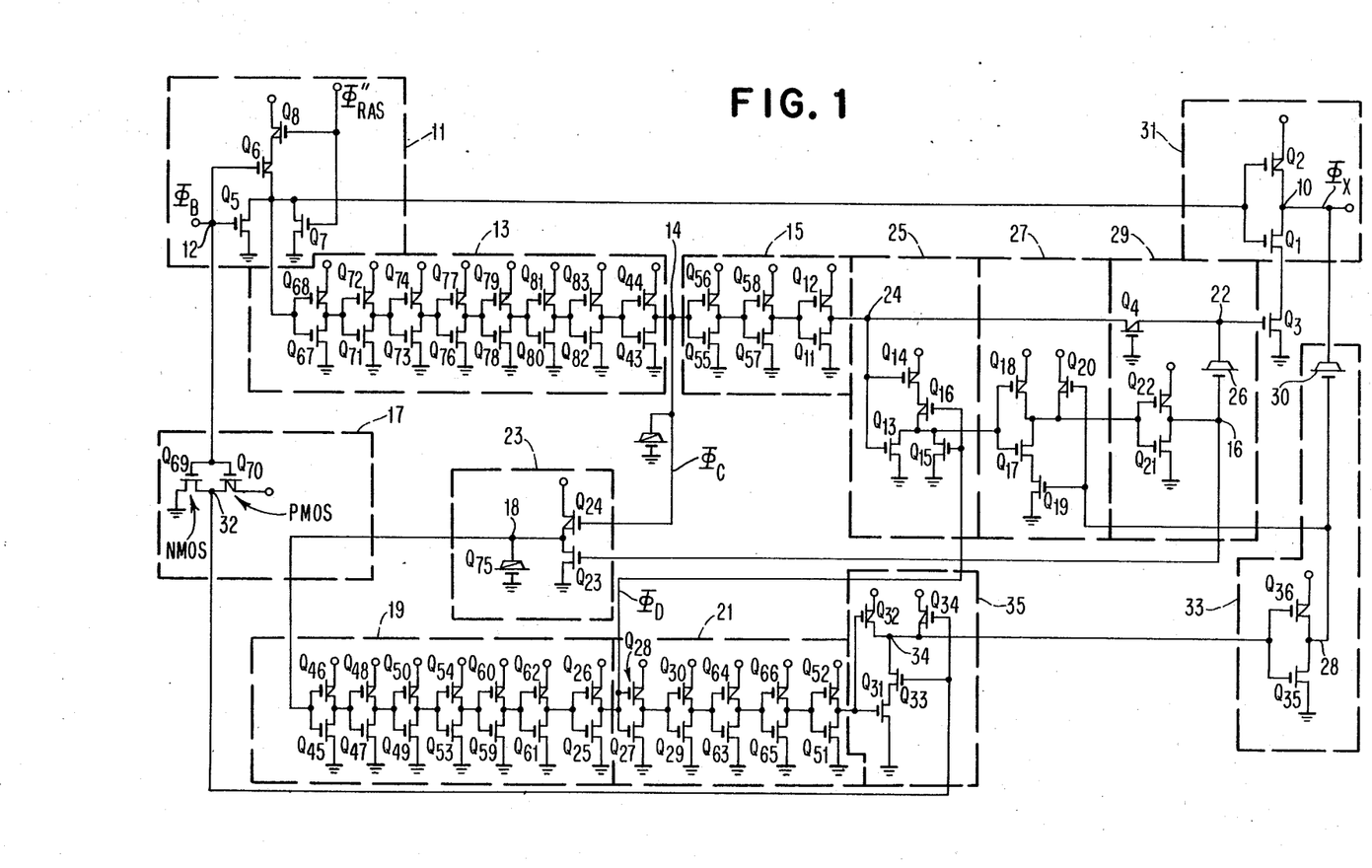
FIG. 1 is a schematic diagram of an embodiment of a word-line clock generator circuit according to the principles of the present invention.

An embodiment of a word-line clock generator is shown in FIG. 1. The clock generator is responsive to a plurality of system clock signals which are designated $\Phi_B$, $\Phi_C$, $\Phi_D$ and $\Phi^{40}{}_{RAS}$. These signals will be described more particularly hereinafter.

In FIG. 1, block 11 is a NOR gate which sums the two clock signals $\Phi_B$ and $\Phi^{41}{}_{RAS}$. Blocks 13 and 15 include a chain of delay circuits. Block 17 is a delay circuit for clock signal $\Phi_B$. Blocks 19 and 21 also include chains of delay circuits. Block 23 functions as a gate wherein clock signal $\Phi_C$ is stored at device $Q_{24}$ and is gated to delay block 19 when a signal is applied to device $Q_{23}$.

Block 25 is a NOR circuit for delayed signal $\Phi_C$ from block 15 and delayed signal $\Phi_D$ from block 21. Block 27 is a NAND circuit for the output of NOR circuit 25 and an external boost output signal (from block 33). Block 29 is an internal boost circuit for node 22 to control the device $Q_3$. Block 31 is a clock driver means and block 33 is an external boosting means. Block 35 performs a NAND function for the delayed $\Phi_D$ signal from block 21 and the delayed $\Phi_B$ signal from block 17.

The specific circuitry for the embodiment of the word-line clock generator is shown within the blocks in FIG. 1. The output waveform signal $\Phi_x$ at the node 10 can be fed into the individual word-line through a selected decoder driver such as will be later described relative to FIG. 4. Clock signal $\Phi_B$ which is applied at node 12 is used to initiate the pull-down of the output signal at the front phase of circuit operation and to reset the output signal at the back phase. Clock signal $\Phi^{41}{}_{RAS}$ is generally used as row circuit clock in DRAM's for faster reset of the circuits. Clock signal $\Phi_C$ is used to preset the circuit ready for boosting, and clock signal $\Phi_D$ is used to trigger boosting the output voltage below the ground. Clock signal $\Phi_C$ is generated from the clock signal $\Phi_B$ through delay circuits from node 12 to node 14, and the clock signal $\Phi_D$ is generated from the clock signal $\Phi_C$ by delay circuits through node 14, node 16, and node 18 to node 20. Transistor devices $Q_1$, $Q_2$ and $Q_3$ form the output stage, in which $Q_1$ and $Q_2$ are connected as complementary pairs to avoid dc current. The PMOS transistor device $Q_4$ is used as pass-gate between the nodes 22 and 24 and, by discharging node 16 from high to low voltage, the voltage at node 22 can be coupled down below ground sufficiently to turn off device $Q_3$ through a coupling capacitor 26. Then, by discharging node 28, the output voltage at node 10 is boosted below ground through the coupling capacitor 30. The design key point is to achieve a boost word-line clock without causing any overshoot at PMOS source/drain. Undershoot at NMOS source/drain can be tolerated as long as it is of the same magnitude as substrate bias voltage.

Figure 2:
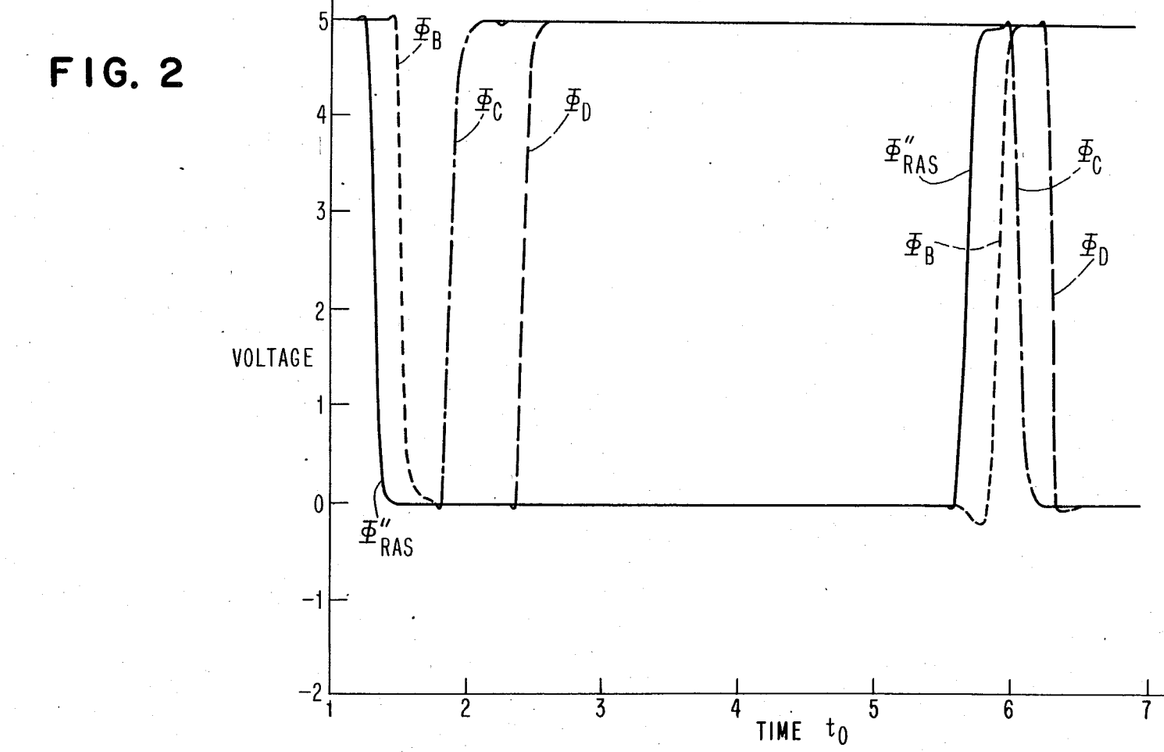
FIGS. 2 and 3 are illustrations of waveforms at selected points in the circuit of FIG. 1 which are useful in describing its mode of operation.
Figure 3:
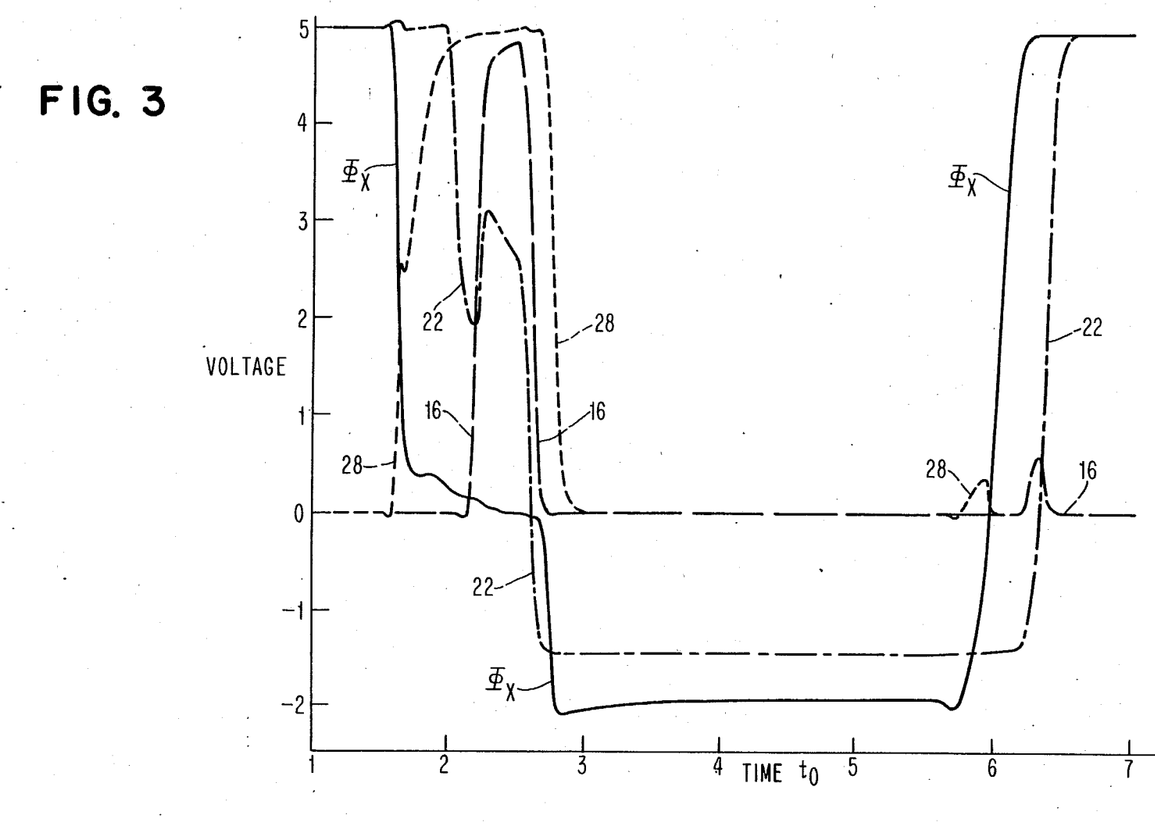

The operation of the circuit illustrated in FIG. 1 is described in the following with reference to the waveforms illustrated in FIGS. 2 and 3. For purposes of explanation, VDD is 5 volts and the substrate bias is −2.5 volts. Before activation, the clock signals $\Phi_B$, $\Phi''{}_{RAS}$, and the output $\Phi_x$ are high (at 5 volts) and $\Phi_C$, $\Phi_D$, are low (at zero volts). The voltages at nodes 28 and 16 are low and the voltage at the node 22 is high. Activation starts by first pulling down signal $\Phi''{}_{RAS}$, and then signal $\Phi_B$, turning on device $Q_1$ such that the node 10 is discharged to ground through devices $Q_1$ and $Q_3$. Meanwhile, the pulling down of signal $\Phi_B$ also triggers the pull-up of node 28 to 5 volts through circuits from node 12, node 32, and node 34 to node 28. Since node 10 has been discharged, no overshoot above 5 V can occur by coupling through the capacitor 30 when node 28 is pulled up to 5 V. After a certain time delay for allowing complete discharge of node 10, the clock signal $\Phi_C$ is pulled up, discharging nodes 24 and 22. Afterwards, node 16 is charged up, which gives a voltage coupling at node 22 through the capacitor 26 but certainly not an overshoot above 5 volts because node 22 has been discharged and the NMOS capacitor 26 is not fully turned on. The rise of node 16 also turns on device $Q_{23}$ to discharge node 18 and subsequently pulling up the clock signal $\Phi_D$. The rise of clock signal $\Phi_D$ first pulls down the node 16, which boosts the node 22 below ground through capacitor 26, completely turning off device $Q_3$. Then the node 28 is pulled down to boost the output node 10 below ground through the capacitor 30. To reset the circuit, the clock signal $\Phi''_{RAS}$ is pulled up to charge the output $\Phi_x$ to 5 volts and then signal $\Phi_B$ is reset to 5 volts and both signals $\Phi_C$ and $\Phi_D$ are reset to ground. Node 22 is charged to 5 volts. Since both nodes 28 and 16 remain low, no overshoot due to capacitor two-way boost occurs.

What has been described is a new CMOS boost word-line clock circuit which can be used for CMOS technology using substrate bias in addition to VDD supply.

In the new CMOS boost word-line clock circuit, only CMOS inverters are used, but no overshoot due to capacitor two-way boost can occur so that the possible junction forward-biasing is completely eliminated. Furthermore, the new CMOS boost word-line clock circuit provides simple timing because the entire circuit operation can be triggered by a single clock $\Phi_B$. ($\Phi''_{RAS}$ is used only for resetting the boost word-line clock circuit in a right time sequence related to other clock circuits used in the entire memory circuits.)

A novel high-speed decoder circuit is also provided in combination with the CMOS boost word-line clock circuit with negative substrate bias described hereinabove which uses NMOS pass-gate in the decoder driver and gives fast word-line boosting. Also, the timing between decoder set and word-line clock activation is not crucial. The circuit is especially important for high-performance CMOS DRAM technology.

Figure 4:
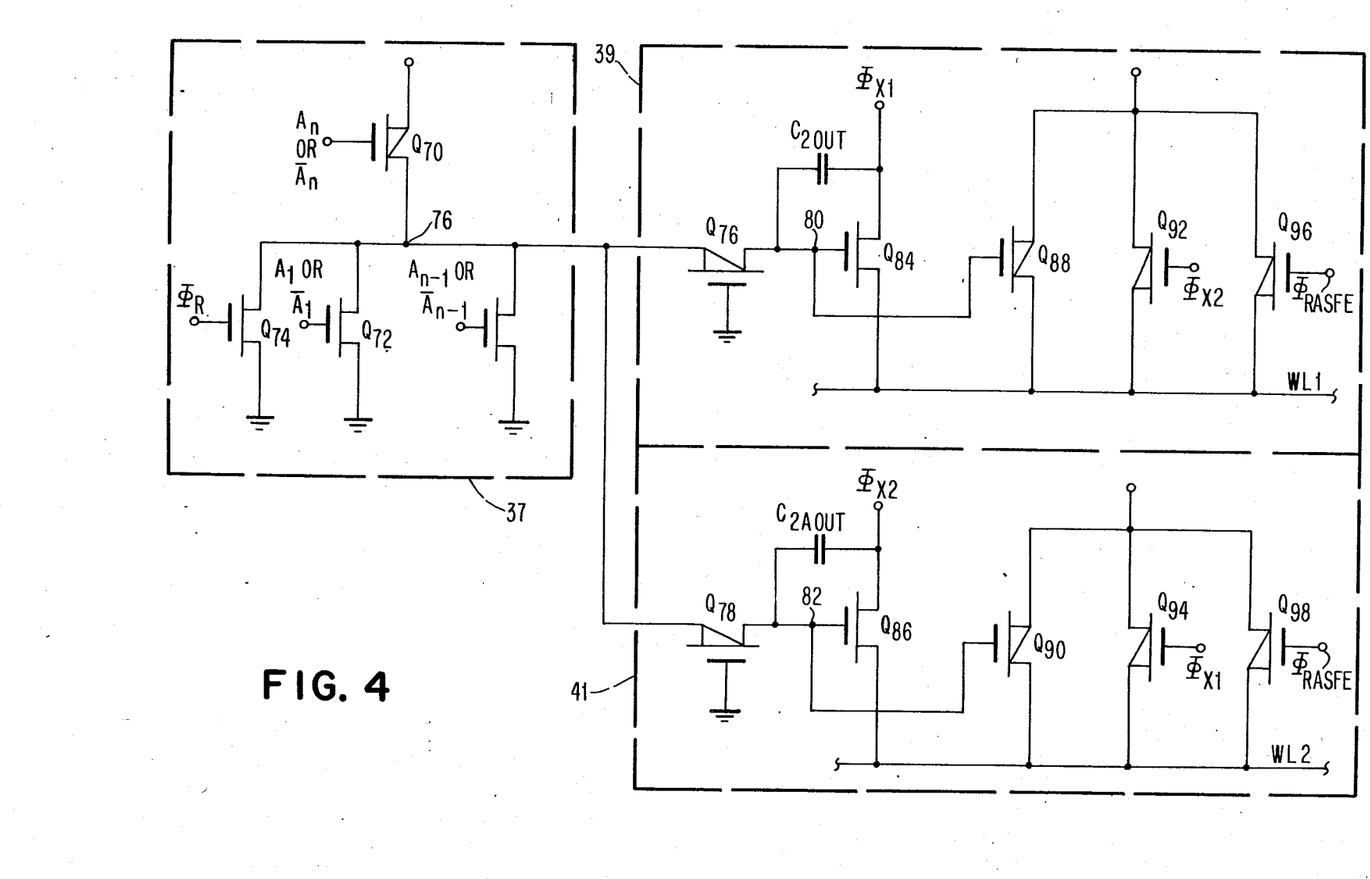
FIG. 4 is a schematic diagram of a decoder to be connected in combination with the word-line clock generator of FIG. 1 according to the principles of the present invention.

The novel high-speed decoder circuitry is shown in FIG. 4. The decoder includes block 37 which specifically performs the decoding function. Blocks 39 and 41 are the decoder driver means which are connected to the word-lines WL1 and WL2. Devices $Q_{76}$ and $Q_{78}$ function as decoupling devices between the decoding means 37 and the driver means 39 and 41. Devices 84 and 86 are word-line pass gate devices. Devices $Q_{88}$, $Q_{92}$, $Q_{90}$ and $Q_{94}$ function as active clamp devices and devices $Q_{96}$ and $Q_{98}$ function as word-line precharge devices. In FIG. 4, it is assumed that the well is biased at 5 V and substrate at $-2.5$ V. Transistors $Q_{70}$, $Q_{72}$ and $Q_{74}$ are parts of a static NOR decoder. The node $Q_{76}$ is charged up from 0 to 5 V in the selected one and remains 0 V in other unselected decoders. $\Phi_{x1}$ and $\Phi_{x2}$ are two word-line boosting clocks generated from word-line boosting clock circuitry described above. $Q_{76}$ and $Q_{78}$ are used to allow nodes 80 and 82 floating in unselected drivers such that they can be coupled down by word-line clocks. $Q_{84}$ and $Q_{86}$ are the pass-gates between word-line clocks and word-lines. $Q_{88}$, $Q_{90}$, $Q_{92}$, $Q_{94}$ are active word-line clamping devices during RAM active operation and $Q_{96}$ and $Q_{98}$ are word-line precharge devices. WL1 and WL2 represent two adjacent word-lines.

Figure 5:
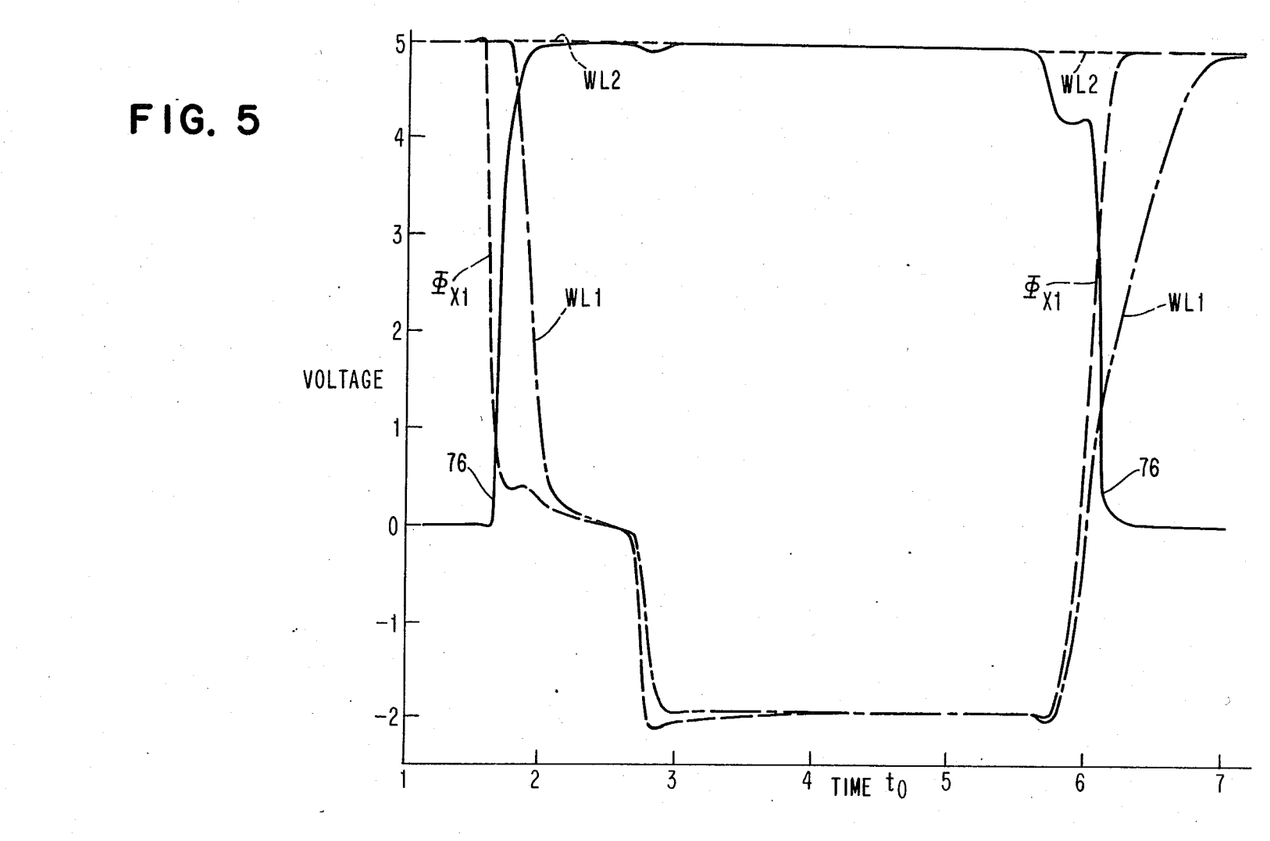
FIGS. 5 and 6 are illustrations of waveforms at selected points on the circuit of FIG. 4 which are useful in describing its mode of operation.
Figure 6:
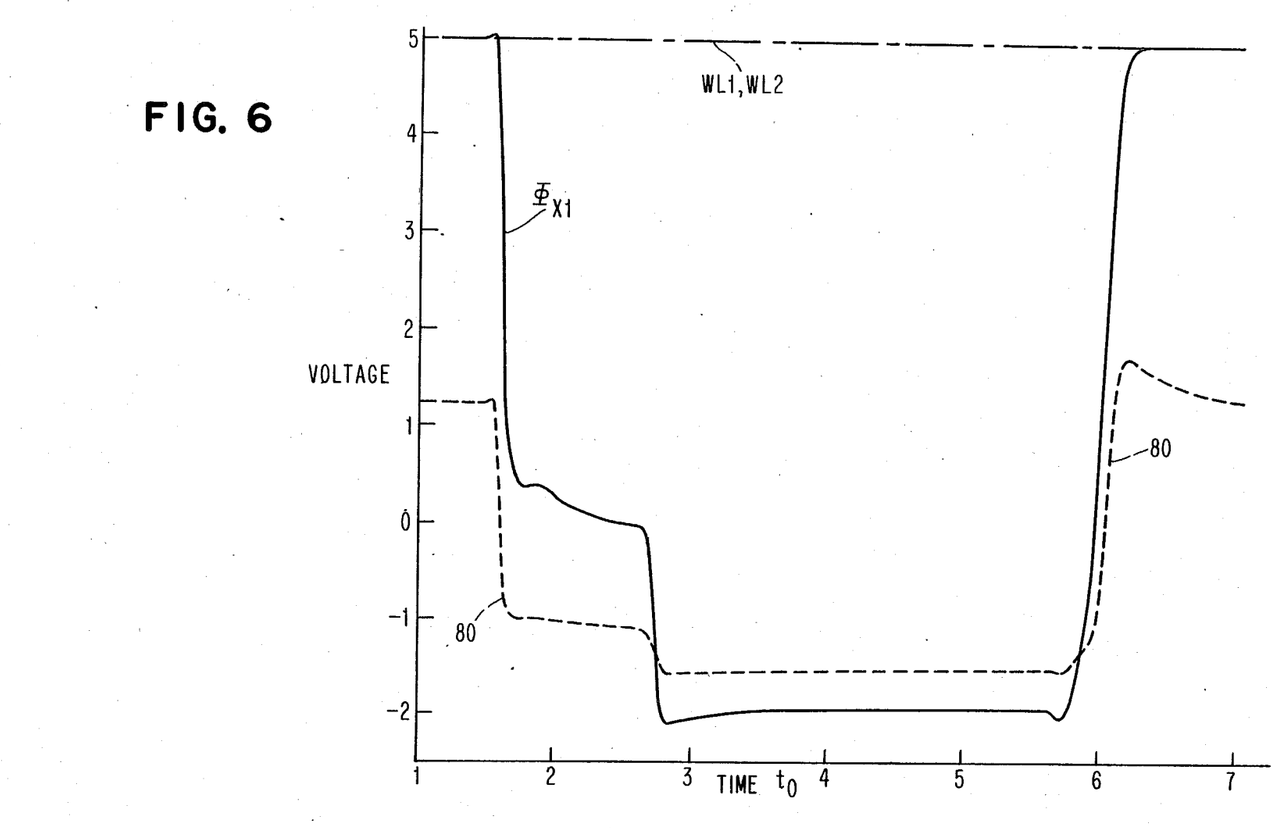

The circuit functions in the following with reference to the simulated waveforms in FIGS. 4 and 5. For a selected decoder (represented by the waveforms in FIG. 4), the node 76 is set to high voltage. This high voltage at node 76 can quickly charge up the nodes 80 and 82 through PMOS transistors $Q_{76}$ and $Q_{78}$. Assuming the word-line clock $\Phi_{x1}$ is pulled down and $\Phi_{x2}$ remains high, WL1 can be quickly discharged through NMOS $Q_{84}$ and no slow source-follower effect in prior art decoder-driver circuits occurs. WL2 is firmly clamped at 5 V ($Q_{94}$ is an active clamping device used to reduce noises on WL2 due to WL1 coupling). Since the voltage at node 80 does not have to be boosted for the selected decoder, the timing between the decoder set and word-line clock activation is not crucial. In prior art decoder drivers, the word-line clock can be activated only after decoder has been selected and this timing constraint slows down the word-line boost. At reset, fast $\Phi_R$ clock reset the decoder to avoid voltage overshoot at node 80 before charging up the word-line. For unselected decoders (represented by the waveforms in FIG. 5), the node 76 is at 0 V. The nodes 80 and 82 are floating at $V_{TP}$, where $V_{TP}$ is the threshold voltage of PMOS $Q_{76}$ and $Q_{78}$, respectively. The pulled-down $\Phi_x$ clock self-boosts down the voltage at node 80 through capacitance $C_{2out}$, which cuts off $Q_{84}$ and further turns on $Q_{88}$ to clamp the WL1. WL2 is also clamped through $Q_{90}$ and $Q_{94}$.

The high speed decoder circuit of FIG. 4 uses an NMOS transistor as transfer device between boosted word-line clock and word-line. Compared to the prior art boost word-line clock and decoder circuits, the word-line pull-down has fast speed because of avoiding slow source-follower effect. Also, the voltage at the pass-transistor gate does not have to be boosted below the boosted word-line level, which relaxes the requirement of having high P+N junction breakdown voltage and high dielectric strength of the gate oxide. In addition, the non-crucial timing between decoder set and word-line clock activation gives faster speed. The decoder driver circuit uses PMOS transistors $Q_{76}$ and $Q_{78}$ to isolate nodes 80 and 82 from decoder node 76, thus allowing self-cut-off pass transistors in unselected decoders.

The above circuits are made in an assumed n-well CMOS technology and assumed pull-down word-line waveforms for PMOS memory cell array. For a P-well CMOS technology, the NMOS transistors are made in many separate P-wells which are biased at ground. The n-substrate is biased at $V_{DD}$. Since only the source or drain regions of $Q_1$ and $Q_3$ in FIG. 1 as well as $Q_{84}$ and $Q_{86}$ in FIG. 4 have voltages at the negative boosted word-line level, these devices can be located at P-wells which are biased at a negative voltage supplied by an on-chip bias generator to avoid junction forward-biasing due to voltage undershoot. Therefore, the general principles disclosed in the above circuits can be widely applied to different technologies and also to pull-up/pull-down word-line waveforms.

Having thus described our invention, what we claim as new, and desire to secure by Letters Patent is:

1. A boost word-line clock generator and decoder-driver structure for a semiconductor memory of the type including a row circuit clock signal $\Phi''_{RAS}$ a reset clock signal $\Phi_B$, comprising:

a boost word-line clock generator circuit including means responsive to said $\Phi''_{RAS}$ and $\Phi_B$ signals for producing a boost circuit preset clock signal $\Phi_C$, and a boost trigger clock signal $\Phi_D$, means responsive to said $\Phi_C$ signal for producing a delayed $\Phi_C$ signal, means for summing said delayed $\Phi_C$ and $\Phi_D$ signal, means for producing a delayed $\Phi_D$ signal, means responsive to said $\Phi_B$ signal for producing a delayed $\Phi_B$ signal, means for providing a first NAND function on said delay $\Phi_B$ signal and delayed $\Phi_D$ signals, an external boosting means connected to the output of said NAND means for producing an external boost signal, means for providing a second NAND function on the outputs of said second summing means and said external boost signal, an internal boost circuit connected to the output of said second NAND means for producing an internal boost signal, a clock driver circuit responsive to said delayed $\Phi_C$ signal, the output of said external boost circuit, the output of said internal boost circuit and the output of said summing means for producing a word-line boosting clock signal, and a decoder-driver means conncted to the output of said clock driver circuit of said word-line clock generator circuit, for decoding word-line input signals for producing boost word-line signals for output word-lines of said semiconductor memory.

2. A boost word-line clock generator and decoder-driver structure for a semiconductor memory of the type including a row circuit clock signal $\Phi''_{RAS}$ and a reset clock signal $\Phi_B$, according to claim 1 wherein said means responsive to said $\Phi''_{RAS}$ and $\Phi_B$ signals for producing said clock signals $\Phi_C$ and $\Phi_D$ includes means for summing said $\Phi''_{RAS}$ and $\Phi_B$ signals a first delay means connected to said summing means for delaying said summed signal therefrom to produce said boost circuit preset clock signal $\Phi_C$, a second delay means responsive to said $\Phi_C$ signal for producing said boost trigger clock signal $\Phi_D$.

3. A boost word-line clock generator and decoder-driver structure for a semiconductor memory of the type including a row circuit clock signal $\Phi''_{RAS}$ and a reset clock signal $\Phi_B$, according to claim 2 wherein said clock driver circuit includes a first transistor device connected to the outputs of said means for producing said delayed $\Phi_C$ signal, the output of said external boost circuit, the output of said internal boost circuit, and the output of said summing means for producing said word-line boosting clock signal.

4. A boost word-line clock generator and decoder-driver structure for a semiconductor memory of the type including a row circuit clock signal $\Phi''_{RAS}$ a reset clock signal $\Phi_B$, according to claim 3 wherein said a decoder-driver means includes a decoder circuit connected to the output of said clock circuit, for decoding word-line input signals and first and second decoder-driver circuits connected between said decoder circuit and output word-lines of said semiconductor memory.

5. A boost word-line clock generator and decoder structure according to claim 4 wherein said first and second decoder-driver circuits each includes a pass-gate device responsive to said word-line boosting clock signal and connected to said associated output word-line for fast discharge of said word-line in response to said word-line boosting clock signal.

6. A boost word-line clock generator and decoder structure according to claim 5 wherein said boost word-line clock generator circuit, said decoder circuit and said first and second decoder-driver circuits are fabricated and disposed on a semiconductor substrate and said structure includes means for biasing said substrate at a bias voltage VDD and wherein said structure further includes means for biasing pass-gate devices in said first and second decoder-driver circuits at a negative voltage with respect to said VDD bias voltage.

* * * * *